(12) United States Patent
Grudowski

(10) Patent No.: US 7,132,704 B2
(45) Date of Patent: Nov. 7, 2006

(54) TRANSISTOR SIDEWALL SPACER STRESS MODULATION

(75) Inventor: Paul A. Grudowski, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 11/036,859

(22) Filed: Jan. 13, 2005

(65) Prior Publication Data

US 2005/0156237 A1 Jul. 21, 2005

Related U.S. Application Data

(62) Division of application No. 10/427,141, filed on Apr. 30, 2003, now Pat. No. 6,967,143, and a division of application No. 10/624,203, filed on Jul. 21, 2003, now Pat. No. 6,902,971.

(51) Int. Cl.
H01L 29/76 (2006.01)
(52) U.S. Cl. ............... 257/288; 257/336; 257/371; 257/408; 257/900; 257/E21.626; 257/E21.64
(58) Field of Classification Search ......... 257/288, 257/900, E21.626, 21.64
See application file for complete search history.

(56) References Cited

U.S. PATENT DOCUMENTS

| 6,274,517 B1 * | 8/2001 | Hsia ............................ 438/783 |
| 6,514,882 B1 * | 2/2003 | Mukai et al. ............... 438/783 |
| 6,924,181 B1 * | 8/2005 | Huang et al. ............... 438/197 |
| 2003/0170969 A1 * | 9/2003 | Ishida et al. ................ 438/596 |

* cited by examiner

Primary Examiner—Kenneth Parker
Assistant Examiner—José R. Díaz

(57) ABSTRACT

A semiconductor fabrication process and the resulting integrated circuit include forming a gate electrode (116) over a gate dielectric (104) over a semiconductor substrate (102). A spacer film (124) exhibiting a tensile stress characteristic is deposited over the gate electrode (116). The stress characteristics of at least a portion of the spacer film is then modulated (132, 192) and the spacer film (124) is etched to form sidewall spacers (160, 162) on the gate electrode sidewalls. The spacer film (124) is an LPCVD silicon nitride in one embodiment. Modulating (132) the spacer film (124) includes implanting Xenon or Germanium into the spacers (160) at an implant energy sufficient to break at least some of the silicon nitride bonds. The modulation implant (132) may be performed selectively or non-selectively either before or after etching the spacer film (124).

18 Claims, 3 Drawing Sheets

TRANSISTOR SIDEWALL SPACER STRESS MODULATION

Under 35 USC § 120, this divisional application claims the benefit of non-provisional application Ser. No. 10/427,141, filed Apr. 30, 2003, now U.S. Pat. No 6,967,143 and is a divisional of application Ser. No. 10/624,203, filed Jul. 21, 2003, now U.S. Pat No. 6,902,971.

BACKGROUND OF THE INVENTION

1. Field of the Invention

The present invention relates generally to the field of semiconductor fabrication and, more particularly, to a process of fabricating transistors having sidewall spacers.

2. Description of Related Art

The use of sidewall spacers in the formation of metal-oxide-semiconductor (MOS) transistors is well known. A spacer is a structure located adjacent to the sidewalls of a transistor's gate. After forming the transistor gates, the spacers are typically formed by following a conformal deposition process with an anisotropic etch. Portions of the deposited film adjacent vertically oriented portions of the pre-deposition topography remain after the etch. Sidewalls spacers provide an implant block that enables, for example, lateral displacement of heavily doped source/drain regions from the edges of the transistor gate. This displacement is beneficial in reducing short channel effects of submicron and deep submicron transistors. In addition, spacers tend to lessen the severity of the wafer topography thereby facilitating subsequent fabrication processes.

In conventional transistor design, the spacers are ideally intended to be electrically inactive. Other than the electrical effects caused by the lateral displacement of the source/drain regions relative to the transistor gate, the spacer is not supposed to effect the operating characteristics of the transistor. Unfortunately, some of the more prevalent spacer materials tend to impact the transistor's performance. Specifically, dielectric materials including silicon nitride are well known to impart stress on the films over which they are deposited. This stress can affect parameters including electron mobility, defect generation, and dopant activation in the underlying substrate thereby altering the transistor's performance. Even worse, these stress effects tend to be non-symmetrical with respect to n-channel and p-channel transistors in a CMOS process.

SUMMARY OF THE INVENTION

The problem highlighted above is address by a semiconductor process and resulting transistor in which the spacer film is subjected to post deposition processing that modulates the film's stress characteristics. The spacer film may be bombarded with an electrically neutral species by ion implantation, as an example, to break at least some of the bonds in the spacer film thereby alter the stress effects of the film. In one embodiment, the spacer film is a tensile dielectric such as LPCVD silicon nitride and the stress modulation processing includes bombarding the spacer film with a heavy implant species such as Germanium or Xenon either selectively (masked) or non-selectively (blanket implant).

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Reference will now be made in detail to the presently preferred embodiments of the invention, examples of which are illustrated in the accompanying drawings. It should be noted that the drawings are in simplified form and are not to precise scale. Although the invention herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention.

Generally speaking, the present invention contemplates modulating the stress characteristics of sidewall spacers in an integrated circuit fabrication process. A transistor gate structure is formed using conventional processing. A sidewall spacer layer or film is then deposited over the wafer and etched anisotropically to form the sidewall spacers. Either before or after the spacer etch, the stress characteristics of the as-deposited spacer film are modulated or altered. The spacer material modulation may be selective, e.g. affecting only transistors of a certain polarity, or non-selective (blanket). In one embodiment, the modulation process includes implanting the spacer material with an electrically neutral implant species at an energy sufficient to effect the breakdown of a significant portion of the spacer material bonds. Transistor processing is then resumed by implanting source/drain regions into the substrate and so forth. The stress modulated spacer material is theorized to have a reduced impact on transistor operating characteristics compared to the un-modulated spacer material. In an implementation in which the spacers are silicon nitride, as an example, the stress modulated nitride is believed to a have a reduced impact on the carrier mobility, especially in p-channel devices.

Figure 1:
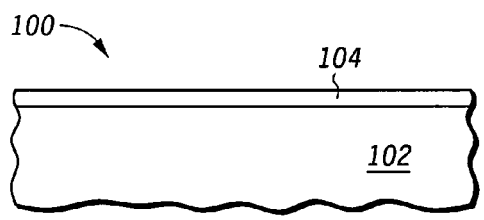
FIG. 1 is a partial cross-sectional view of a semiconductor wafer in which a gate dielectric is formed over a semiconductor substrate.

Referring now to FIG. 1, a gate dielectric film 104 is formed over a semiconductor substrate 102 of a semiconductor wafer 100. In one embodiment, gate dielectric 104 is a silicon dioxide film formed by the thermal oxidation of the upper surface of semiconductor substrate 102. Thermal oxidation of substrate 102 is achieved by exposing the wafer to an oxidizing ambient (e.g., $O_2$, $H_2O$) at a temperature in excess of 900° C. as will be well known to those in the field of semiconductor fabrication processes. In this embodiment, gate dielectric 104 has a thickness of anywhere from 10 to 150 angstroms. In other embodiments, gate dielectric 104 is a "high K" dielectric having a dielectric constant greater than 4.0. High K dielectrics are desirable for use in gate dielectric films to achieve sufficient capacitance with a thicker film. Materials suitable for use in a high K embodiment of dielectric 104 include various metal-oxide compounds such as hafnium-oxide as well as other materials including aluminum oxide, hafnium silicate, zirconium silicate, hafnium aluminate, lanthanum aluminate, zirconium aluminate, and lanthanum oxide. Additional information regarding high K dielectrics is found in, for example, Samavedam, Transistor having a high K dielectric and short gate length and method therefor, U.S. Pat. No. 6,514,808.

An upper portion of semiconductor substrate 102 typically includes a monocrystalline semiconductor material such as silicon on which gate dielectric 104 is formed. In one embodiment particularly suitable for use with low power applications such as mobile and wireless devices, semiconductor substrate 102 is a silicon-on-insulator (SOI) substrate in which the monocrystalline silicon is a relatively thin film (i.e., less than 10,000 angstroms) formed over a buried oxide (not shown) with a thickness roughly in the range of 1,000 to 20,000 angstroms.

Figure 2:
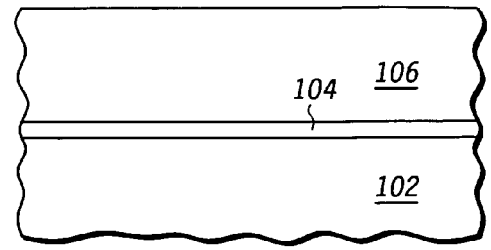
FIG. 2 illustrates processing subsequent to FIG. 1 in which a gate electrode film is formed over the gate dielectric.

Referring now To FIG. 2, a gate electrode film 106 is formed over gate dielectric 104. In one embodiment, gate electrode film 106 is a polysilicon film formed by thermally decomposing silane in a reactor chamber maintained at a temperature in the range of approximately 550–650° C. The polysilicon film is likely deposited as undoped silicon and subsequently doped with an n-type (e.g., phosphorous, arsenic) or p-type (e.g., boron) dopant using ion implantation. In other embodiments, the polysilicon may be doped in-situ or by diffusion. In still other embodiments, gate electrode film may comprise a metal or metal compound such as tantalum silicon nitride, titanium nitride, a combination thereof, or other suitable metal.

Figure 3:
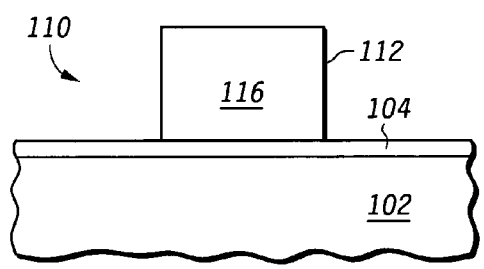
FIG. 3 illustrates processing subsequent to FIG. 2 in which the gate electrode film is patterned to form a gate electrode structure.

Referring now to FIG. 3, the fabrication of integrated circuit 110 continues by patterning gate electrode film 106 to form a gate electrode 116 having substantially vertical sidewalls 112. Patterning of gate electrode 116 is achieved using photolithography and anisotropic or dry etch techniques that are well known in the field.

Figure 4:
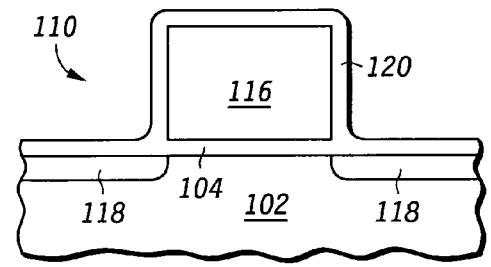
FIG. 4 illustrates processing subsequent to FIG. 3 in which a liner dielectric is formed over the substrate and the gate electrode.

Referring now to FIG. 4, a liner dielectric film 120 is deposited over gate electrode 116. In one embodiment, liner dielectric 120 is a low-K dielectric having a dielectric constant of less than approximately 4.0. In other embodiments, liner dielectric 120 includes a film of chemically vapor deposited (CVD) silicon-oxide or silicon-nitride. The liner oxide is used to provide an effective etch stop layer for a subsequent sidewall spacer etch process. As such, the liner oxide material is preferably different than the material contemplated for use as the sidewall spacer. In an embodiment in which the spacer material is silicon nitride, for example, the liner oxide is preferably silicon oxide or some other dielectric.

One or more implant steps (not explicitly represented in FIG. 4) may be performed after forming liner oxide 120. In the depicted embodiment, as an example, one or more extension implants is performed to introduce extension regions 118 into substrate 102 using gate electrode 116 as an implant mask. In this manner, extension regions 118 within substrate 102 are laterally disposed on either side of or self-aligned to gate 116. Extension regions 118 may be used to control the threshold voltage and improve the saturated drain current of the resulting device without sacrificing significant margin in terms of breakdown voltage or leakage. Extension regions 118 are typically formed with a relatively low dose, low energy implant that produces a relatively shallow and lightly doped region. While FIG. 4 illustrates a single transistor, it will be appreciated that, in a CMOS process, extensions for the n-channel devices and for the p-channel devices are formed separately, using appropriate masking steps and different implants as is well known in the field.

Figure 5:
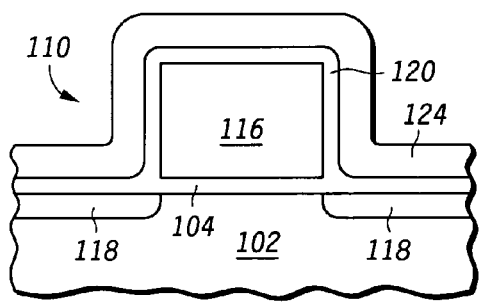
FIG. 5 illustrates processing subsequent to FIG. 4 in which a spacer film is formed over the liner dielectric.

Referring now to FIG. 5, a spacer film 124 is deposited over liner dielectric 120. Spacer film 124 is a dielectric film from which the transistor sidewall spacers will be formed in a subsequent processing step. In one embodiment in which liner dielectric 120 is a silicon oxide, spacer film 124 is a CVD silicon nitride film. In this embodiment, the spacer film is preferably formed by reacting dichlorosilane or silane and ammonia in a reactor maintained at a temperature in the range of 300 to 800° C. Still more preferably, the silicon nitride spacer film most beneficially affected by the stress modulation processing described below is characterized as a low pressure CVD (LPCVD) silicon nitride formed by thermally reacting dichlorosilane and ammonia at a temperature in the range of approximately 550 to 750° C. The characteristics of LPCVD silicon nitride are well known in the field of semiconductor processing. For purposes of this disclosure, LPCVD silicon nitride is stoichiometric $Si_3N_4$ or nearly stoichiometric silicon nitride having a Si/N ratio of less than approximately 0.8. LPCVD silicon exhibits significant tensile stress, particularly with respect to silicon. The stress properties of LPCVD silicon nitride and dielectric films more generally are believed to have an impact on at least some device parameters that can influence performance. In the case of LPCVD silicon nitride, for example, its tensile stress characteristics are believed to reduce carrier mobility in the underlying substrate, especially in the case of p-type silicon. Thus, silicon nitride film 124 is believed to have a negative impact on device performance that may be more pronounced for p-channel devices.

Figure 6A:
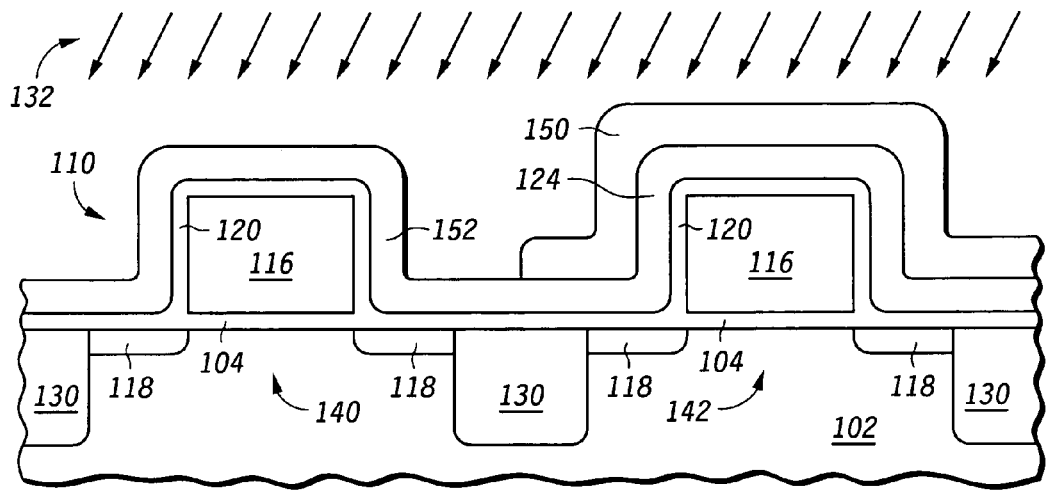
FIG. 6A illustrates processing subsequent to FIG. 5 according to an embodiment in which a portion of the spacer film is subjected to a stress modulation implant.
Figure 6B:
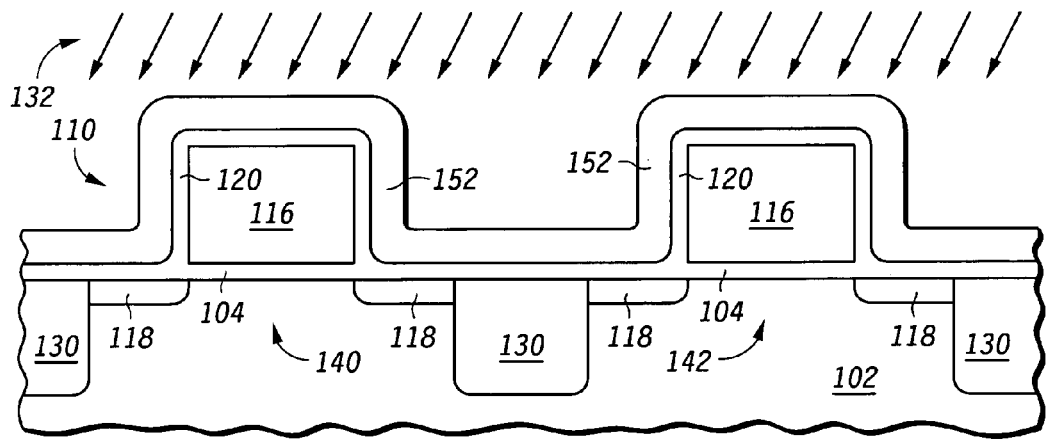
FIG. 6B illustrates processing subsequent to FIG. 5 according to an embodiment in which the entire spacer film is subjected to a stress modulation implant.

Referring now to FIG. 6A and FIG. 6B, alternative processing sequence embodiments of the present invention are shown to illustrate the stress modulation processing contemplated by the present invention. FIG. 6A depicts an embodiment in which a resist mask 150 is employed to prevent the modulation of selected portions of film 124. FIG. 6B represents a non-selective embodiment in which the entire spacer film is subjected to stress modulation processing. In either embodiment, the portion of spacer dielectric film 124 subjected to the stress modulation processing is identified herein as modulated spacer film 152. The embodiment depicted in FIG. 6A illustrates a process flow in which the spacer film over transistors of a first type, represented by reference numeral 140, is exposed to the stress modulation processing while the spacer film over transistors of a second type, represented by reference numeral 142, are masked from the stress modulation processing by photoresist mask 150. Transistors 140 and 142 are electrically isolated from each other by isolation dielectric 130 intermediate between the two transistors. First transistor 140 may represent all transistors having a particular polarity. In an embodiment employing a silicon nitride spacer film 124, as an example, photoresist mask 150 may mask the spacer film over all n-channel transistors while exposing the spacer film over all p-channel devices.

In the embodiments depicted in FIG. 6A and FIG. 6B, the stress modulation processing includes an ion implantation step identified by reference numeral 132. Stress modulation ion implant 132 uses an implant species and energy that is sufficient to break a substantial portion of the bonds within spacer film 124. Implant 132 may be performed at an angle or tilt with respect to the wafer surface to improve the locality of the modulation. In other words, implanting straight down through the spacer film may result in the majority of the modulation occurring in horizontally oriented portions of the film that are removed during etch. The tilted implant addresses this problem by implanting more directly into the vertically oriented portions of the spacer film, which are the spacers left behind after etch. In the tilted implant embodiment, the implant sequence may be performed multiple times with different wafer orientations to achieve a uniform effect for each transistor without regard to its orientation on the wafer. In one embodiment, for example, the implant represented by reference numeral 132 includes four separate implants performed using four wafer orientations (e.g., wafer flat down, up, left, and right).

The implant species may be an inert species such as Xenon or another species, such as Germanium, that is electrically neutral with respect to the transistor. Some implant species enable the use of a greater implant angle than others. In one embodiment of a Germanium implant, a 10 degree tilt is used at an implant energy of 80 keV and a dose of approximately $5\times10^{14}$ ions/cm$^2$. In a Xenon embodiment, in contrast, a 45 degree tilt may be used with an implant energy of 180 keV or more and a dose of $5\times10^{14}$ ions/cm$^2$. In addition to affecting the implant angle, the implant species may affect the choice of whether to use resist mask 150. Bombarding a dielectric that is tensile as deposited with Xenon, for example, is theorized to have a beneficial effect on the p-channel transistors, but a potentially detrimental effect on n-channel transistors whereas Germanium is theorized to have a beneficial effect on p-channel transistors without significantly affecting n-channel transistors. Thus, in one embodiment, resist mask 150 is employed in the case of a Xenon implant species to mask the n-channel devices from the implant while resist mask 150 is omitted in the case of a Germanium implant species.

Figure 7:
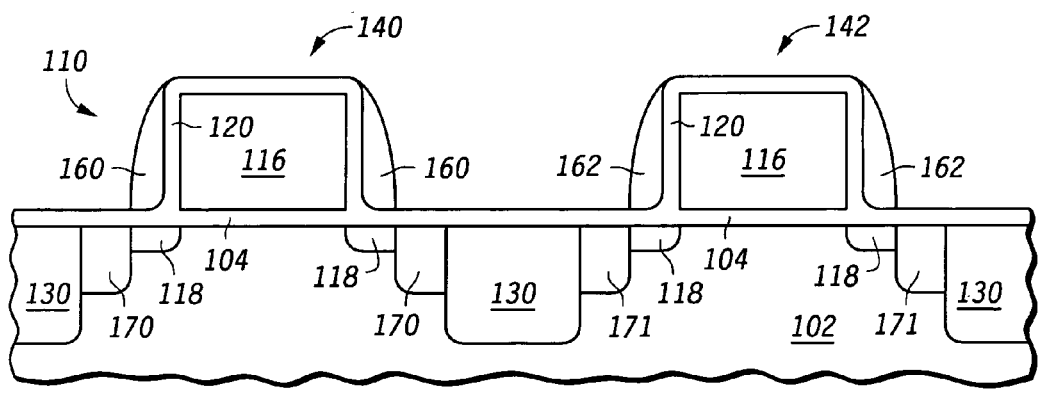
FIG. 7 illustrates processing subsequent to FIG. 6A or FIG. 6B in which the spacer film is etched to form spacer structures including at least some stress modulated spacer structures.

Referring to FIG. 7, the spacer film has been etched to form sidewall spacers represented by reference numerals 160 and 162, which represent the portions of the spacer film left behind after etch. The spacer etch is a directional (anisotropic) dry etch that uses liner oxide 120 as an etch stop. In a silicon nitride spacer film embodiment, the dry etch process preferably includes an NF$_4$ based plasma etch step to achieve adequate selectivity with respect to liner dielectric 120.

In either of the processes sequences represented by FIG. 6A and FIG. 6B, the sidewall spacers 160 over transistor 140 are stress modulated spacers in accordance with the present invention. The sidewall spacers 162 may be stress modulated as well depending upon whether the modulation implant mask 150 of FIG. 6A was used. If the implant mask 150 is used during the modulation implant, then sidewall spacers 162 over transistor 142 are not stress modulated. Stress modulated spacers 160 are characterized by a lower tensile stress than the as-deposited spacer film 124 of FIG. 5. For a spacer film 124 having an as-deposited tensile stress in excess of approximately 1500 MPa, the tensile stress of spacer modulated spacers 160 is preferably less than approximately 500 MPa after stress modulation processing.

As shown in FIG. 7, source/drain regions 170 and 171 have been formed in transistors 140 and 142 respectively according to process sequences well known in the field. Specifically, source/drain regions 170 are typically implanted into substrate 102 using a resist mask (not shown) over transistor 142 while source/drain regions 171 are implanted into substrate 102 using a resist mask (not shown) over transistor 140. In an embodiment where transistor 140 is a p-channel device and transistor 142 is an n-channel device, source/drain regions 170 represent regions containing a high concentration of a p-type impurity such as boron while source/drain regions 171 represent regions containing a high concentration of an n-type impurity such as arsenic or phosphorous. Because the source/drain implant uses gate electrodes 116 and spacer structures 160 and 162 as an implant block on unmasked portions of the wafer, source/drain regions 170 and 171 are self-aligned to their respective spacer structures 160 and 162. Source/drain regions 170 and 171 are isolated from one another by an intervening isolation dielectric represented by reference numeral 130.

Thus, FIG. 7 illustrates integrated circuit 110 having a first transistor 140 of a first transistor type (p-type) and a second transistor 142 of a second type (n-type). First transistor 140 has sidewall spacers 160 disposed on either side of its gate electrode 116 while second transistor 142 has sidewall spacers 162 disposed on either side of its gate electrode 116. In one embodiment, sidewall spacers 160 and 162 are silicon nitride spacers and still more preferably, LPCVD silicon nitride spacers that exhibit tensile stress characteristics. Sidewall spacers 160 have been stress modulated such that their tensile stress is substantially less than the as-deposited tensile stress. Preferably, the tensile stress of sidewall spacers 160 is less than approximately 500 MPa. The modulated spacers 160 according to one embodiment include a distribution of implanted Ge or Xe ions. In one embodiment, the sidewall spacers 162 of transistor 142 are un-modulated such that their tensile stress characteristics are substantially greater than sidewall spacers 160. Sidewall spacers 160, for example, may exhibit tensile stress in excess of 1500 MPa. In another embodiment, sidewall spacers 160 and 162 have both been stress modulated with an implant species such as Ge that does not degrade the performance of p-channel or n-channel devices. In addition, to their gate electrodes 116 and sidewall spacers 160 and 162, transistors 140 and 142 further include a gate dielectric 104 disposed between gate electrode 116 and substrate 102 and source/drain regions 170 and 171 respectively, self-aligned within substrate 102 to spacers structures 160 and 162 respectively. In the depicted embodiment, transistors 140 and 142 further include a liner dielectric between spacers 160 (and 162) and the sidewalls of their respective gate electrodes.

Figure 8:
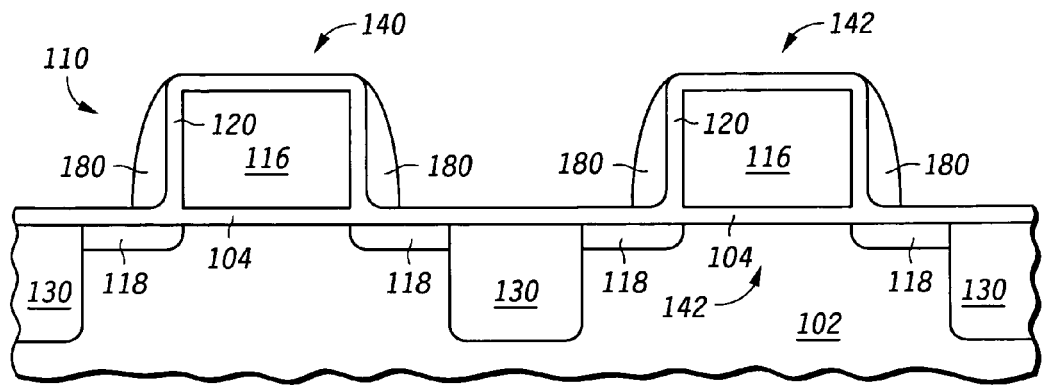
FIG. 8 illustrates processing subsequent to FIG. 5 according to an embodiment in which the spacer film is etched prior to any stress modulation.
Figure 9:
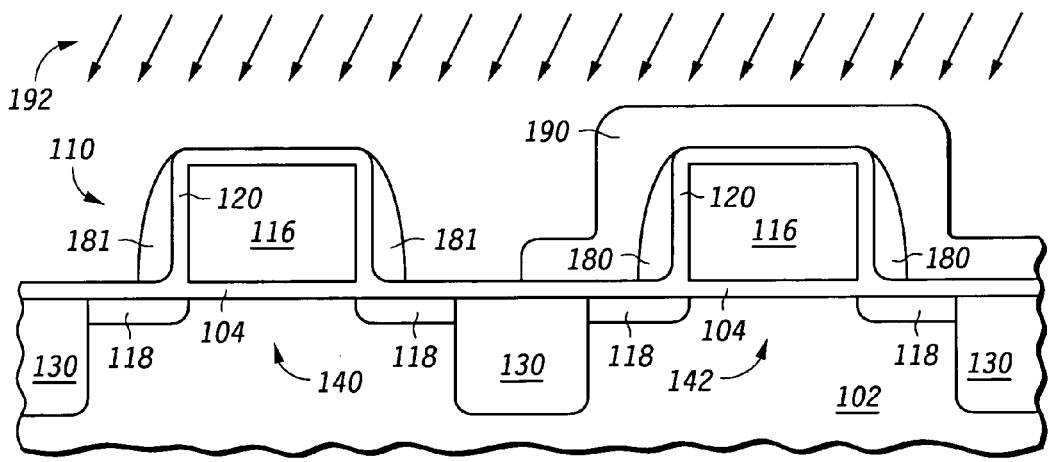
FIG. 9 illustrates processing subsequent to FIG. 8 in which the wafer is subjected to a stress modulation implant.
Figure 10:
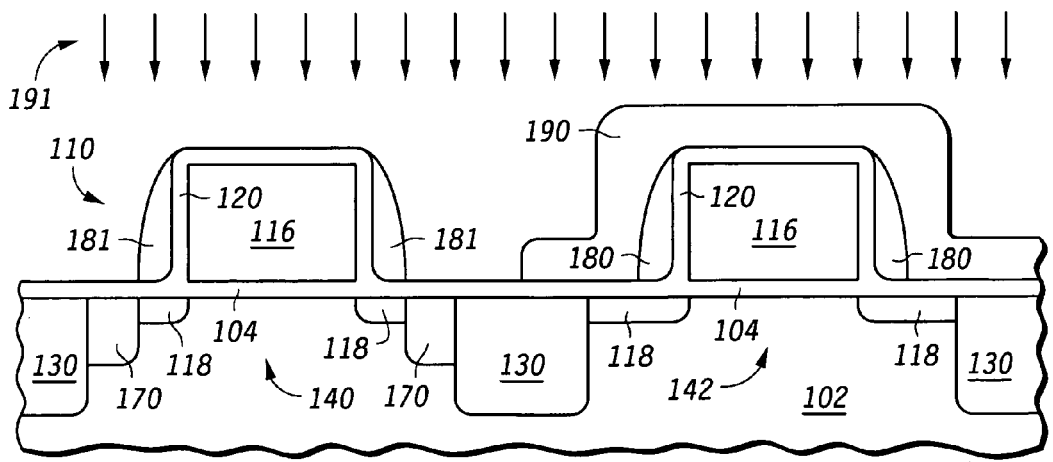
FIG. 10 illustrates processing subsequent to FIG. 9 in which source/drain regions are formed in the wafer.

Referring now to FIGS. 8 through 10, an alternative processing sequence is depicted to illustrate an embodiment in which it is desirable to selectively modulate the spacer stress without introducing an additional masking step. In this embodiment, the p-mask and/or n-mask employed for source/drain implants are also used to control mask the stress modulation implant. Referring to FIG. 8, processing subsequent FIG. 5 is shown. In this process sequence, spacer film 124 of FIG. 5 is etched (as described with respect to FIG. 7 above) prior to stress modulation processing to form spacers 180 on sidewalls of the gate electrodes 116 of transistors 140 and 142. Because the spacer etch is performed prior to stress modulation processing, it will be appreciated that the stress characteristics of spacers 180 are substantially unchanged from the characteristics of spacer film 124.

In FIG. 9, stress modulation processing in the form of stress modulation implant 192 is performed using a resist mask 190 over transistor 142. In this manner, stress modulated spacers 181 are formed on sidewalls of gate electrode 116 of transistor 140 while spacers 180 on the gate sidewalls of transistors 142 remain un-modulated. The stress modulation implant 192 is qualitatively equivalent to the stress modulation implant 132 of FIGS. 6A and 6B. The precise implant energy, dose, and tilt angle parameters of implant 192 may differ from implant 132. The tile angle, for example, may be reduced in implant 192 because the spacer structures are already exposed during the implant.

FIG. 10 depicts a source/drain implant 191 to form source/drain regions 170 self-aligned to spacers 181. Implant 191 is performed while the stress modulation resist mask 190 is still in place. In this embodiment, it will be appreciated, that selective stress modulation is achieved without incurring an additional masking step by delaying the stress modulation processing until the source/drain implant sequence. The sequence of implants 191 and 192 may be reversed in other embodiments. In addition, the stress modulation implant 192 may be performed in a non-selective manner by implanting prior to forming mask 190. This embodiment might be desirable, for example, in cases where it is desirable to perform the stress modulation implant into the spacers structures directly rather than into a film that is subsequently etched to form the spacers.

Although FIG. 10 does not illustrate the formation of source/drain regions 172 for transistor 142, it will be appreciated that this additional processing is well known. The integrated circuit 110 produced following the processing illustrated in FIG. 8–10 and the subsequent completion of the 140 and 142 transistors by forming the appropriate source/drain regions is substantially equivalent to the integrated circuit 110 depicted in FIG. 7. In either processing sequence, the resulting device from the described embodiment of the invention is theorized to exhibit improved performance characteristics relative to conventional CMOS devices by incorporating stress modulated, LPCVD silicon nitride sidewall spacers on at least some transistors (e.g., the p-channel transistors) in the device.

In a variation on the process flow of FIGS. 8 through 10, differentially sized spacer processing is used in conjunction with differentially modulated spacers, as described above, to achiever greater differentiation between n-type and p-type devices. In one such embodiment, etching of the as-deposited spacer film (film 124 of FIG. 5) is delayed until the formation of the n-mask (or p-mask) resist used for source/drain implant processing. The resist mask 190 shown in FIG. 9, for example, would be formed prior to spacer film etch. After this first resist mask is formed over selected transistors (all p-type or all n-type transistors, e.g.), the spacer modulation implant is performed in addition to a first spacer etch process and the corresponding source/drain implant. Thereafter, the first resist mask is stripped and a second resist mask is formed over the remaining transistors. A second spacer etch process is then executed followed by the appropriate source/drain implant. The first and second spacer etch processes result in spacers having different lateral dimensions (widths). Additional details of a suitable differentially sized spacer process are described in co-pending U.S. patent application of Grudowski et al., entitled Semiconductor Fabrication Process Using Transistor Spacers of Differing Widths, Ser. No. 10/285,374, filed Oct. 31, 2002. The combination of differently sized and differently modulated spacers for n-type and p-type transistors provided additional flexibility to optimize the performance characteristics of n-type and p-type transistors.

Thus it will apparent to those skilled in the art having the benefit of this disclosure that there has been provided, in accordance with the invention, a process for fabricating an integrated circuit that achieves the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

What is claimed is:

1. An integrated circuit, comprising;
   first and second transistors, each including a gate electrode over a gate dielectric over a semiconductor substrate;
   first spacer structures adjacent sidewalls of the first gate electrode and second spacer structures adjacent sidewalls of the second gate electrode; and
   first source/drain regions within the substrate and self-aligned to the first spacer structures and second source/drain regions within the substrate and self-aligned to the second spacer structures, wherein the first and second sidewall spacer structures comprise silicon nitride having a Si/N ratio of less than 0.8 and further wherein the first sidewall spacer structures include a distribution of an impurity selected from Xenon and Germanium.

2. The integrated circuit of claim 1, wherein the second sidewall spacer structures exhibit a tensile stress characteristic that is greater than a corresponding characteristic of the first spacer structure.

3. The integrated circuit of claim 2, wherein the first transistor is a p-channel transistor arid the second transistor is an n-channel transistor.

4. The integrated circuit of claim 1, wherein the first transistor is a p-channel transistor and the second transistor is an n-channel transistor and wherein the second sidewall spacer structures further include a distribution of an impurity selected from Xenon and Germanium.

5. An integrated circuit, comprising:
   a plurality of gate electrodes overlying a gate dielectric overlying a semiconductor substrate; and
   sidewall spacers laterally disposed on either side of the gate electrodes, wherein at least a portion of the sidewall spacers include sidewall spacers exhibiting a first tensile stress and wherein at least a second portion of the sidewall spacers include sidewall spacers exhibiting a second tensile stress;

wherein the sidewall spacers comprise silicon nitride; and wherein the second portion of the sidewall spacers further includes an implanted species.

6. The integrated circuit of claim 5, wherein the implanted species comprises Xenon.

7. The integrated circuit of claim 6, wherein the second portion of the sidewall spaces comprises a portion of the integrated circuit overlying PMOS transistors.

8. The integrated circuit of claim 7, wherein the implanted species further comprises Xenon implanted at an energy of at least 180 keV.

9. The integrated circuit of claim 7, wherein the implanted species further comprises Xenon implanted at an implant angle of approximately 45°

10. The integrated circuit of claim 5, wherein the implanted species comprises Germanium.

11. The integrated circuit of claim 10, wherein the implanted species further comprises Germanium implanted at an energy of at least 80 keV and an implant angle of approximately 10°.

12. A integrated circuit, comprising:

silicon nitride spacers on sidewalls of a gate electrode overlying a semiconductor substrate;

wherein at least some of the sidewall spacers include an implanted species; and wherein the stress characteristics of the sidewall spacers having the implanted species differ from the stress characteristics of other sidewall spacers.

13. The integrated circuit of claim 12, wherein the silicon nitride spacers comprise silicon nitride formed using a thermal CVD process in which the deposition temperature is in the range of approximately 550 to 750° C.

14. The integrated circuit of claim 13, wherein the implanted species is selected from Xenon and Germanium.

15. The integrated circuit of claim 14 wherein the Xenon is implanted into the at least some of the sidewall spacers using an implant angle of 10° or greater.

16. The integrated circuit of claim 15, wherein the Xenon is implanted into at least some of the sidewall spacers using an implant energy not less than 80 keV.

17. The integrated circuit of claim 16, wherein the spaces having the implanted species comprise spacers of n-channel transistors.

18. The integrated circuit of claim 12, wherein the implanted species comprises Germanium implanted at energy of 80 keV and an implant angle of approximately 10°.

* * * * *